US006830968B1

(12) United States Patent
Kim et al.

(10) Patent No.: US 6,830,968 B1
(45) Date of Patent: Dec. 14, 2004

(54) SIMPLIFIED TOP OXIDE LATE PROCESS

(75) Inventors: Deok-kee Kim, Wappingers Falls, NY (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,384

(22) Filed: Jul. 16, 2003

(51) Int. Cl.$^7$ .......................................... H01L 21/8238
(52) U.S. Cl. ..................... 438/209; 438/212; 438/244; 438/268; 438/387
(58) Field of Search ................... 438/206, 209, 438/212, 243, 244, 268, 386, 387, FOR 212, FOR 220, FOR 430

(56) References Cited

U.S. PATENT DOCUMENTS

| | | | | |
|---|---|---|---|---|
| 6,172,390 B1 | * | 1/2001 | Rupp et al. | 257/302 |
| 6,326,275 B1 | * | 12/2001 | Harrington et al. | 438/386 |
| 6,348,374 B1 | * | 2/2002 | Athavale et al. | 438/243 |
| 6,359,299 B1 | * | 3/2002 | Gruening | 257/301 |
| 6,426,252 B1 | * | 7/2002 | Radens et al. | 438/243 |
| 6,426,253 B1 | * | 7/2002 | Tews et al. | 438/243 |
| 6,429,068 B1 | * | 8/2002 | Divakaruni et al. | 438/243 |
| 6,610,573 B2 | * | 8/2003 | Weis | 438/268 |
| 6,620,676 B2 | * | 9/2003 | Malik et al. | 438/243 |
| 6,620,677 B1 | * | 9/2003 | Hummler | 438/243 |
| 6,630,379 B2 | * | 10/2003 | Mandelman et al. | 438/243 |
| 2003/0060003 A1 | * | 3/2003 | Hecht et al. | 438/240 |

OTHER PUBLICATIONS

A Highly Cost Efficient 8F2 DRAM Cell with a Double Gate Vertical Transistor Device for 100 nm and Beyond, R. Weis et al., Infineon Technologies, IEDM 01–414, pp. 18.7.1–18.7.4, 3/01 IEEE.

* cited by examiner

*Primary Examiner*—George Fourson
*Assistant Examiner*—Joannie Adelle Garcia
(74) *Attorney, Agent, or Firm*—DeLio & Peterson, LLC; Kelly M. Reynolds; Steven Capella

(57) ABSTRACT

An improved TOL process with a partial lithography-assisted sacrifcial oxide strip to prevent arsenic out-diffusion from polysilicon studs during gate oxidation. The invention prevents arsenic out-diffusion during gate oxidation from polysilicon studs by completely covering polysilicon studs with an oxide layer during gate oxidation, therby mantaining nitrogen amounts in the thin gate oxide regions, and hence, maintaining gate oxide thickness and avoiding any increase in Vt's for thin gate devices.

19 Claims, 4 Drawing Sheets

SIMPLIFIED TOP OXIDE LATE PROCESS

BACKGROUND OF INVENTION

The present invention generally relates to integrated circuit (IC) memory devices and, more particularly, to a process for protecting thin gate oxides by covering polysilicon studs during gate oxidation in vertical metal oxide semiconductor field effect transistor (MOSFET) dynamic random access memory (DRAM) arrays.

A DRAM circuit usually includes an array of memory cells interconnected by rows and columns, which are known as wordlines (WLs) and bitlines (BLs), respectively. Typically, a DRAM memory cell comprises a MOSFET connected to a capacitor, such as a vertical MOSFET having a trench capacitor. Vertical MOSFETs allow for an effective size reduction in bit densities, and as such, the use of such vertical MOSFETs has increased over the years as the need to overcome the scalability limitations of planar MOSFET DRAM access transistors has also increased.

The use of vertical MOSFETs is not yet widespread and several characteristics need to be optimized. In particular, in the formation of a memory cell in vertical MOSFET DRAM arrays, an array top oxide (ATO) is needed to isolate the passing word-lines from active areas on the substrate. Typical processes for forming these isolating ATO areas include forming an array top oxide layer in the presence of a pad nitride layer of the DRAM. A variety of methods exist in the art for forming array top oxides, such as, top oxide early, top oxide nitride and top oxide late procedures.

Typically, in a top oxide early (TOE) procedure, an array top oxide area is formed with pad nitride being present in the support. Any remaining pad nitride in the support is then removed, a gate oxide is grown and then a gate poly is deposited. Similarly, in top oxide nitride (TON) procedures, an array top oxide area is formed after the pad nitride has been stripped in both the array and support areas. Array top oxide is then removed in the support followed by gate oxidation and deposition of a gate poly. However, a disadvantage of such procedures is that both TOE and TON processing require a large number of masks, and thus processing steps, for fabrication of these ATO areas.

Further procedures for forming array top oxide areas include a top oxide late (TOL) scheme. In TOL processing, a pad nitride layer is removed from the entire surface of the DRAM. Thereafter, a gate oxide is grown and a gate poly is deposited in the support area. An array top oxide layer is then deposited after removal of the gate poly in the array. The advantages of TOL processing include reduced number of masks, processing steps and manufacturing costs as well as providing a litho-friendly structure with a flat surface after the top oxide CMP in comparison to TOE and TON processes. However, it is significantly more difficult to achieve compared to TOE and TON.

Additionally, during TOL fabrication of the gate oxidation for support devices in vertically-arranged-device memory cells arsenic from the gate poly of the vertical array devices, i.e., polysilicon stud, can out-diffuse and react with the nitrogen. This undesirably results in thicker oxides in the thin gate oxide regions, which in turn, increases the Vt of the support device. Numerous steps are required, including depositing a liner layer over the polysilicon stud, in order to prevent the out-diffusion of arsenic during the formation of the gate oxidation for support devices in vertical DRAM.

Accordingly, a need continues to exist in the art for providing further improved, simplified techniques of forming an array top oxide area in vertical DRAM that require a reduced number of masks, processing steps and manufacturing costs, provides a litho-friendly structure, and prevents out-diffusion of arsenic from the gate poly during TOL fabrication of the gate oxidation for the support devices in the vertical memory cell.

SUMMARY OF INVENTION

Bearing in mind the problems and deficiencies of the prior art, it is therefore an object of the present invention to provide an improved and simplified method for forming an array top oxide area in vertical DRAM.

Another object of the present invention is to provide a method for forming an array top oxide area in vertical DRAM via an improved, simplified top oxide late (TOL) scheme that protects thin gate oxides during gate oxidation by covering the polysilicon studs of the vertical DRAM.

It is another object of the present invention to provide a method for forming an array top oxide area in vertical DRAM that requires a reduced number of masks and processing steps.

A further object of the invention is to provide a method for forming an array top oxide area in vertical DRAM that prevents out-diffusion of arsenic from the gate poly during TOL fabrication of the gate oxidation for the support devices in the vertical memory cell.

It is yet another object of the present invention to provide a method for forming an array top oxide area in vertical DRAM that reduces costs.

Still other objects and advantages of the invention will in part be obvious and will in part be apparent from the specification.

The above and other objects and advantages, which will be apparent to one of skill in the art, are achieved in the present invention, which, is directed to in a first aspect a method of providing an array top oxide over an array of trenches containing trench capacitors and overlying vertical transistors. The method includes providing a substrate having a first area and a second area. Preferably, the first area is an array area, while the second area is a support area. A sacrificial oxide layer is provided over the first and second areas and such sacrificial oxide layer is removed only from the second area. A gate oxide layer is then provided over the second area and a gate conductor layer deposited over both first and second areas. The gate conductor layer is then removed only from the first area. Subsequently, an array top oxide layer is deposited over the first and second areas, and the array top oxide layer is removed from the second area so as to leave remaining portions of the array top oxide layer only in the first area.

Prior to the step of growing the sacrificial oxide layer, the method may further include removing a pad nitride layer in both the first and second areas to expose a pad oxide layer in both the first and second areas, removing at least a portion of the pad oxide layer from both the first and second areas and then growing the sacrificial oxide layer over exposed surface areas of the substrate. The first and second areas may then be implanted.

The sacrificial oxide layer may be removed from the second area only by providing a mask over the first area to protect the first area during the sacrificial oxide layer removal processing. This mask is removed from second area prior to growing the gate oxide.

Gate oxide is grown at least in the second area, and gate conductor is deposited in the first and the second area.

Further, the gate conductor layer may be removed from the first area also by providing a mask over the second area to protect the second area during the gate conductor layer removal processing. This mask is removed prior to depositing the array top oxide layer.

In another aspect, the invention relates to a method of providing an array top oxide over an array of trenches containing trench capacitors and overlying vertical transistors. The method includes providing a substrate having an array area and a support area and then providing a sacrificial oxide layer over the array and support areas. The sacrificial oxide layer is removed from the support area and then a gate oxide layer is provided over the support area. A gate conductor layer is then deposited over the array and support areas and the gate conductor layer removed from the array area only. An array top oxide layer is then deposited over the array and support areas. This array top oxide layer may be deposited by high density plasma deposition. The array top oxide layer is removed from the support area by planarization so as to leave remaining portions of the array top oxide layer only in the array area. In removing the sacrificial oxide layer only from the support area, a first mask is provided over the array area to protect such array area during the sacrificial oxide layer removal processing. This first mask is then removed from the array area prior to providing the gate oxide layer over the support area. A second mask is then provided over the support area to protect the support area during the gate conductor layer removal processing. The second mask is also removed prior to depositing the array top oxide layer. These first and second masks may both comprise etch support lithography masks.

In accordance with the invention, the step of removing the sacrificial oxide layer only from the support area prevents out-diffusion from the array area, particularly arsenic out-diffusion, while during the step of growing the gate oxide layer over the support area, the sacrificial oxide layer protects the underlying array area to also prevent any out-diffusion there-from, particularly arsenic out-diffusion.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

Figure 1:
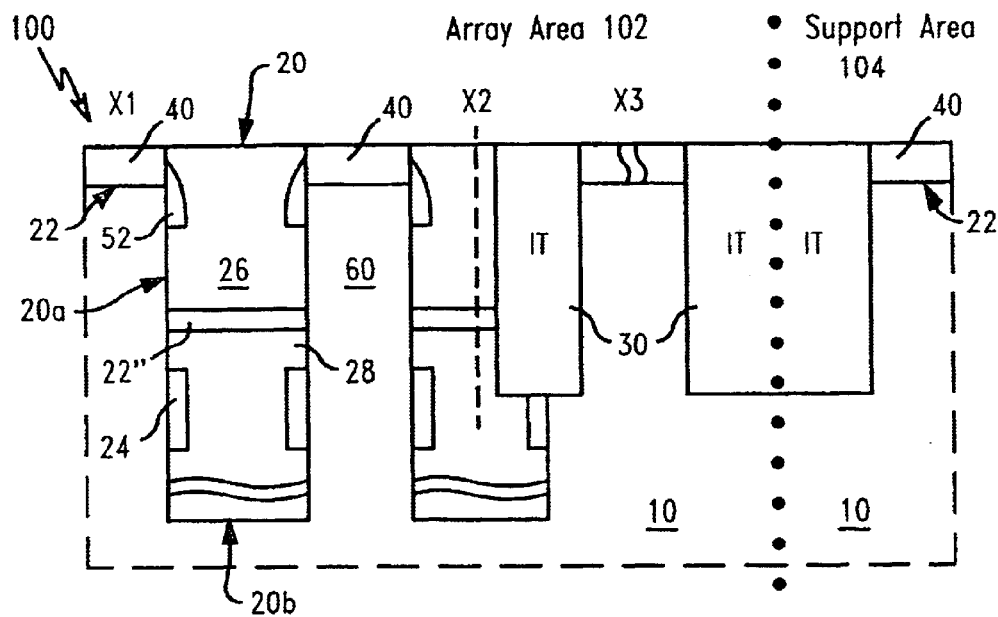
FIG. 1 is a cross sectional view of a DRAM for processing in accordance with the invention.

In describing the preferred embodiment of the present invention, reference will be made herein to FIGS. 1–8 of the drawings in which like numerals refer to like features of the invention. Features of the invention are not necessarily shown to scale in the drawings.

Figure 2:
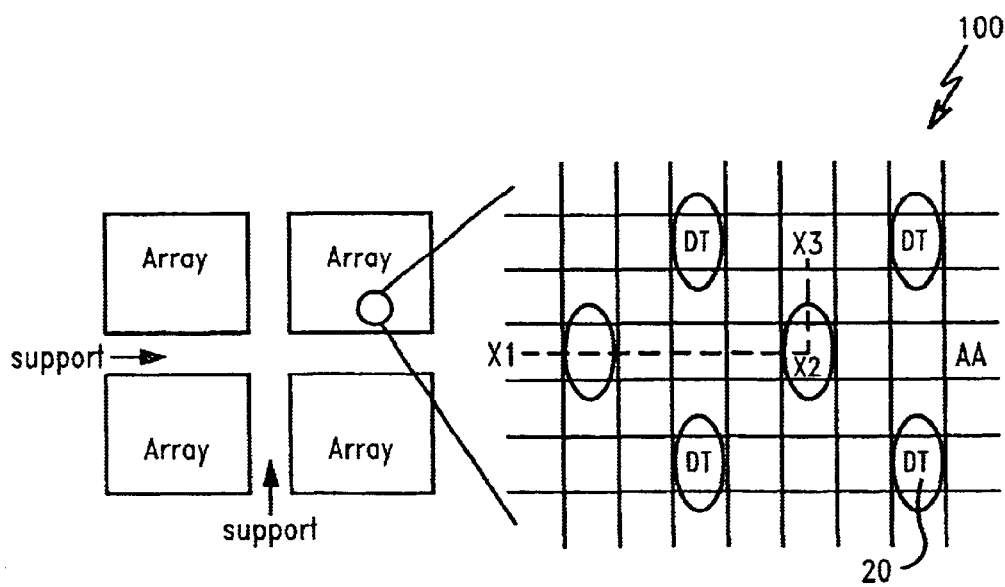
FIG. 2 is a top plan view of the DRAM of FIG. 1.

Referring to FIG. 1, there is shown a cross-sectional view of a section of a DRAM 100 containing vertical MOSFET arrays formed in a semiconductor wafer substrate 10 along cross sections X1–X2 and X2–X3. For ease of understanding, FIG. 2 illustrates a top down view of the plurality of trench locations X1, X2 and X3 of DRAM 100. The DRAM 100 is provided with both an array area 102 of the substrate 10 and a support area or circuitry 104 of the substrate 10.

Initially, pad oxide layer 22 and pad nitride layer 40 are deposited over the substrate and then a plurality of deep trenches 20 are formed from the top surface down into the substrate 10, preferably a silicon substrate, by known patterning and etching techniques. These deep trenches 20 are formed within the DRAM 100 array area 102 of the substrate 10. An outer buried plate in the substrate and a node dielectric (not shown) are then formed. A collar oxide 24 is formed within a middle portion of each of these deep vertical trenches 20 for preventing the formation of a parasitic transistor and then the trenches filled with polysilicon to a sufficient depth within the lower portion 20b of the deep trenches to act as the conductor for the storage node.

A trench top oxide layer 22' is deposited within the deep trenches and then a gate oxide is deposited in the upper portions 20a of the trenches over the trench top oxide layer 22'. Subsequently, these upper portions of the deep trenches are filled with additional polysilicon to a sufficient depth to serve as the gate conductors (GC) for the DRAM cell. The DRAM is provided with vertical sidewall spacers 52 within the deep trenches 20, whereby these sidewall spacers are formed by depositing a SiN layer and etching using an anisotropic dry etch technique, such as, Reactive Ion Etch (RIE). The remaining portions of the deep trenches are completely filled with additional polysilicon and the substrate surface area is then planarized to remove any excess polysilicon fill material.

Thus, as shown in FIG. 1, the trench top oxide layer 22' divides the deep trenches into a vertical transistor portion residing in the upper portion 20a of the trench, above the trench top oxide layer 22', and a trench capacitor portion residing in the lower portion 20b of the trench, below the trench top oxide layer 22'. The trench top oxide layer isolates the pass transistor from the trench capacitor by isolating the gate oxide in the upper portion of the trenches from the storage node in the lower portion of the trenches. As shown, the collar oxide 24 is located within each of the trenches 20 to a depth just below the trench top oxide layer 22', i.e., below the transistor portion of deep trenches 20, so as to prevent outward leakage of charge stored within the capacitor (not shown) located in the lower portion of trenches 20.

The DRAM 100 further includes a buried strap poly 28 that out-diffuses into the substrate to form the buried strap within the lower portion of the trenches. A region of the vertical pass transistor 60 is formed in the substrate by known techniques. The DRAM 100 also includes gate 26 within the upper portions of the trenches 20, which, is the gate of the pass transistor.

Shallow trench isolations are formed in both the array area 102 and support area 104 of DRAM 100 by patterning and etching in both the array 102 and support 104 areas, which, are subsequently filled with dielectric, preferably an oxide fill. These isolation trenches 30 are adjacent to each other and isolate adjacent deep trenches 20 within separate array areas as shown by the top plan view of DRAM 100 in FIG. 2, which, is a top down view of the array area 102 of DRAM 100 as shown in FIG. 1 along the directional X1, X2, and X3. Any excess dielectric material is then removed, preferably, by a chemical mechanical polishing technique.

The above steps of processing DRAM 100 proceed in a normal fashion through the steps of forming the vertical deep trenches 20, having gate conductors and capacitors therein, through planarizing the substrate surface, such as by chemical mechanical polishing, after formation of isolation trenches 30.

Figure 3:
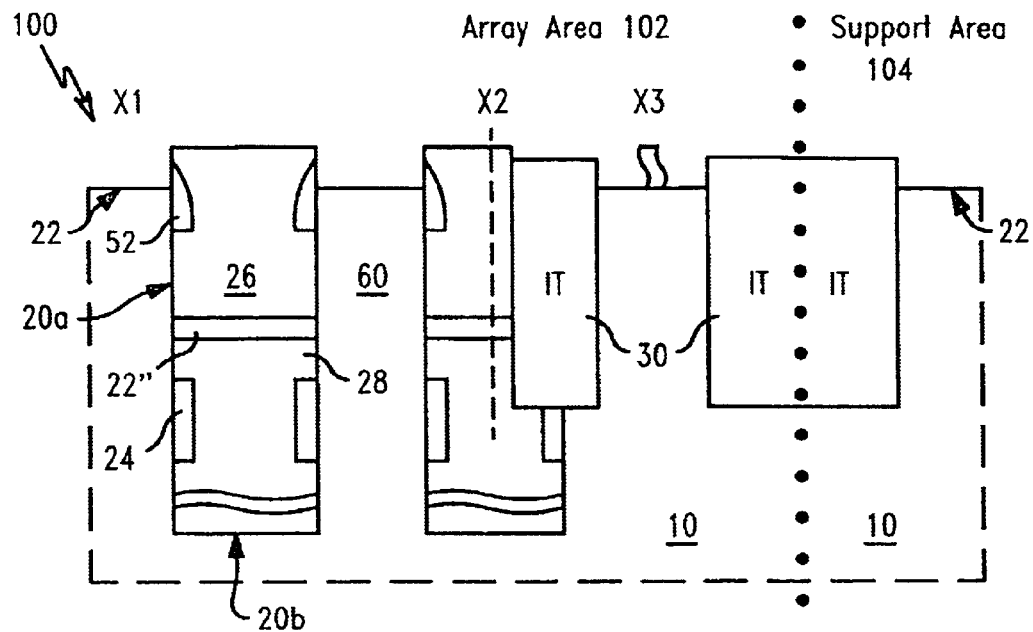
FIG. 3 is a cross sectional view of the step of deglazing the DRAM of FIGS. 1 and 2.

Referring to FIG. 3, the entire substrate surface of DRAM 100 is then deglazed, preferably, by a wet etching. The deglazing step is crucial as it removes any residual oxide residing over the pad nitride layer 40 in both the array and support areas of the DRAM, as well as slightly recesses the isolation trenches to a desired height. Subsequently, after any residual oxide is stripped and isolation trenches 30 recessed, the pad nitride layer 40 is stripped in both array areas 102 and support areas 104 of substrate 10, thereby leaving the pad oxide layer 22 exposed as shown in FIG. 3.

Figure 4:
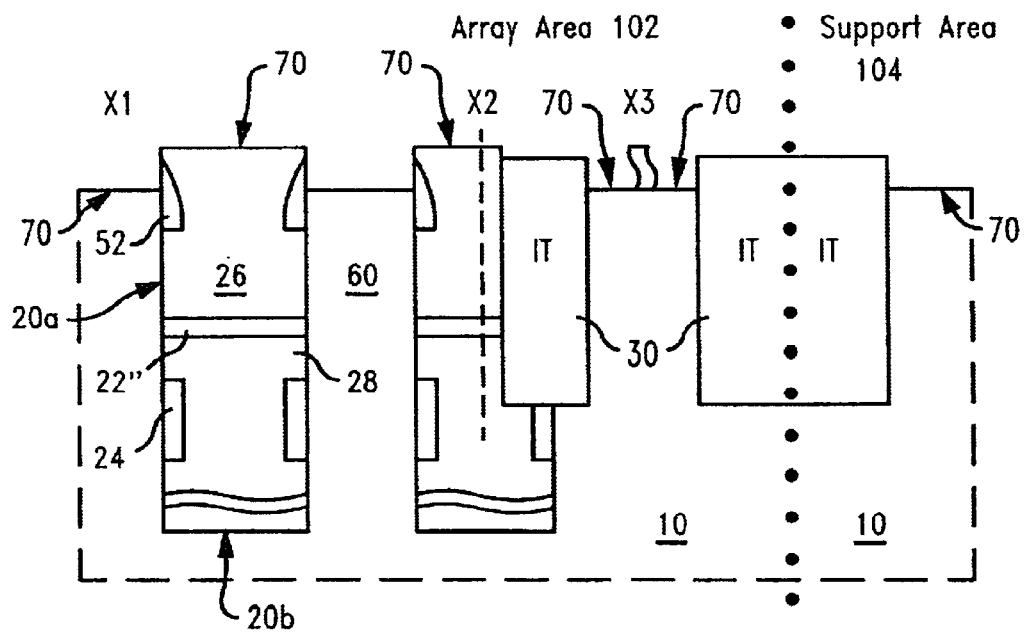
FIG. 4 is a cross sectional view of the step of stripping a pad oxide layer from array and support areas of the DRAM of FIG. 3, followed by growing a sacrificial oxide layer over all exposed surface areas of such stripped DRAM.

Referring to FIG. 4, the pad oxide layer 22 is then stripped from both the array areas 102 and the support areas 104 on substrate 10. Preferably, the pad oxide layer 22 is stripped using a wet etch technique. A sacrificial oxide layer 70 is then grown over all exposed surface areas of the DRAM, in both array and support areas, for the array and the support implants. However in the preferred embodiment, wherein the isolation trenches 30 comprise oxide, grown oxide will not form over the oxide isolation trenches 30 as shown in FIG. 4.

Figure 5:
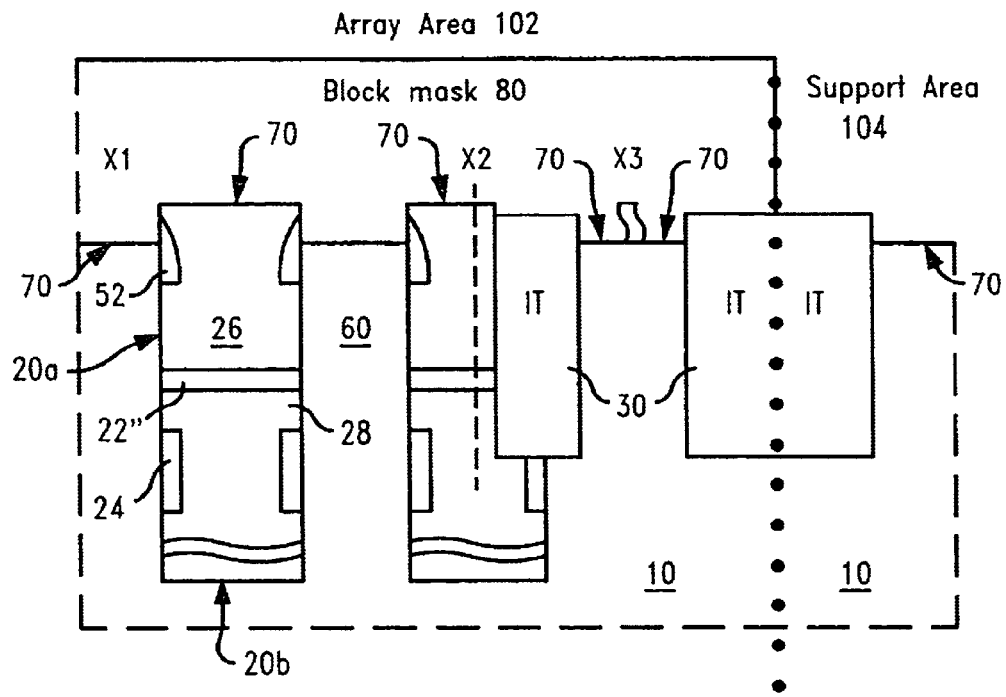
FIG. 5 is a cross sectional view showing the step of stripping the sacrificial oxide of FIG. 4 in the support area only using a block mask 80 that entirely covers only the array area 102.
Figure 6:
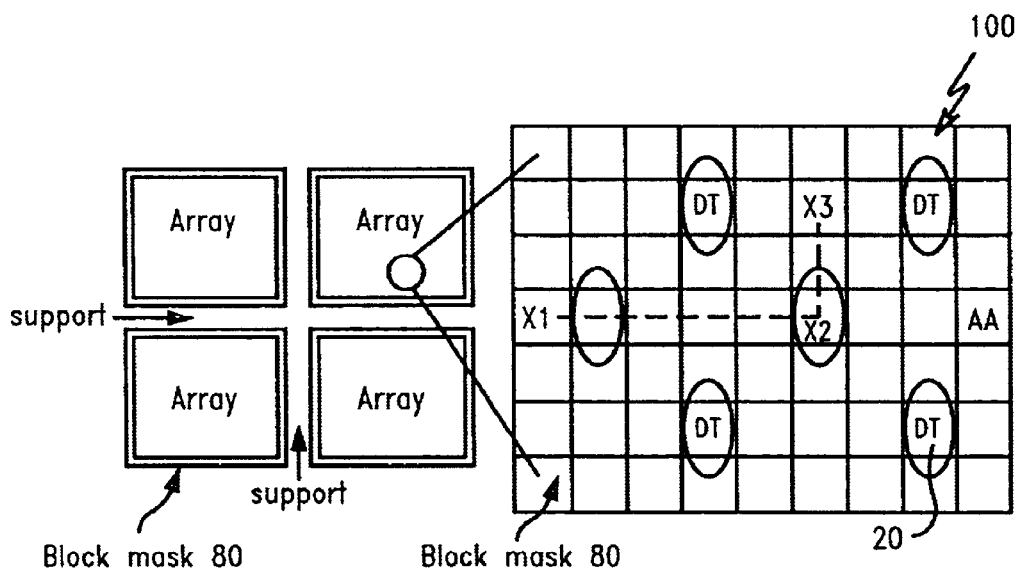
FIG. 6 is a top plan view of the process step of FIG. 5.

After the sacrificial oxide layer 70 is grown over all exposed surfaces in both array and support areas, a block mask 80 is provided only over the array areas 102, as shown in the cross sectional view of FIG. 5 and the top plan view of FIG. 6. This block mask 80 preferably comprises an etch support lithography mask that is spin-coated so as to entirely cover only the array area 102, while not covering any of the support area 104.

Using the block mask 80 that entirely covers the array area only, the sacrificial oxide layer 70 is completely stripped from the support area only. During this process, the block mask 80 protects the entire underlying array area of the substrate. Conventional wet etch chemistries, such as buffered hydrofluoric acids, are preferably used to strip the sacrificial oxide in the support area only using block mask 80 to protect the array area.

In accordance with the invention, the array area is protected during removal of the sacrificial oxide layer 70 in the support area thereby preventing any out-diffusion of arsenic from the array area of the DRAM during gate oxidation. The present invention advantageously provides processing ease as the block mask 80 is directly deposited over the grown sacrificial oxide layer 70, only in the array area, without the use of any additional processing layers. That is, the present invention significantly simplifies the process of forming an array top oxide in the array while protecting thin gate oxides by covering polysilicon studs during gate oxidation.

Figure 7:
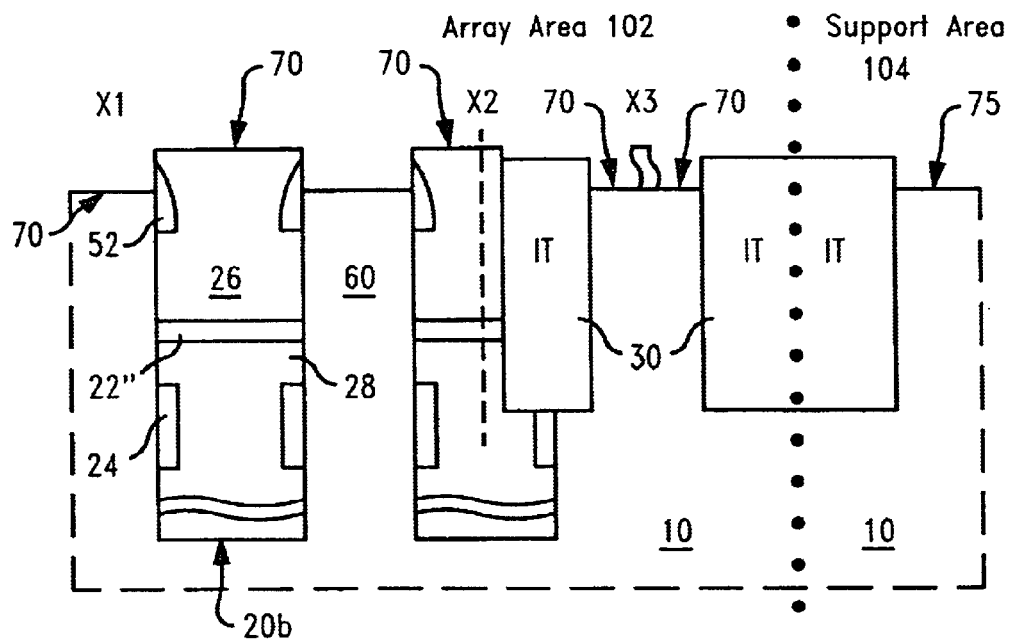
FIG. 7 is a cross sectional view of the step of removing the block mask, followed by growing a gate oxide layer at least over support areas of the DRAM of FIGS. 5 and 6.

As shown in FIG. 7, after the sacrificial oxide is removed from the support area only using block mask 80, the block mask 80 is removed from the surface of the substrate. This is preferably accomplished by stripping block mask 80 by a fusion strip technique. Once the block mask 80 is stripped, a gate oxide layer(s) 75 is thermally grown only over exposed substrate 10 surface areas in the support area 104 of the substrate. During this step, the array area is already covered with grown oxide layer 70, and as such, an insignificant amount, if any, of gate oxidation will grow over the oxide layer 70 in the array area.

A critical feature of the invention is that during this step of growing gate oxide layer 75, any arsenic out-diffusion of the As-doped polysilicon studs in the array area is prevented as such studs are entirely covered with grown oxide layer 70. Without this grown oxide layer 70 covering the polysilicon studs, arsenic can out-diffuse and react with nitrogen that has been implanted in thin gate oxide regions to grow thinner oxides, and hence, results in an increase of the Vt's for thin gate oxide devices.

Figure 8:
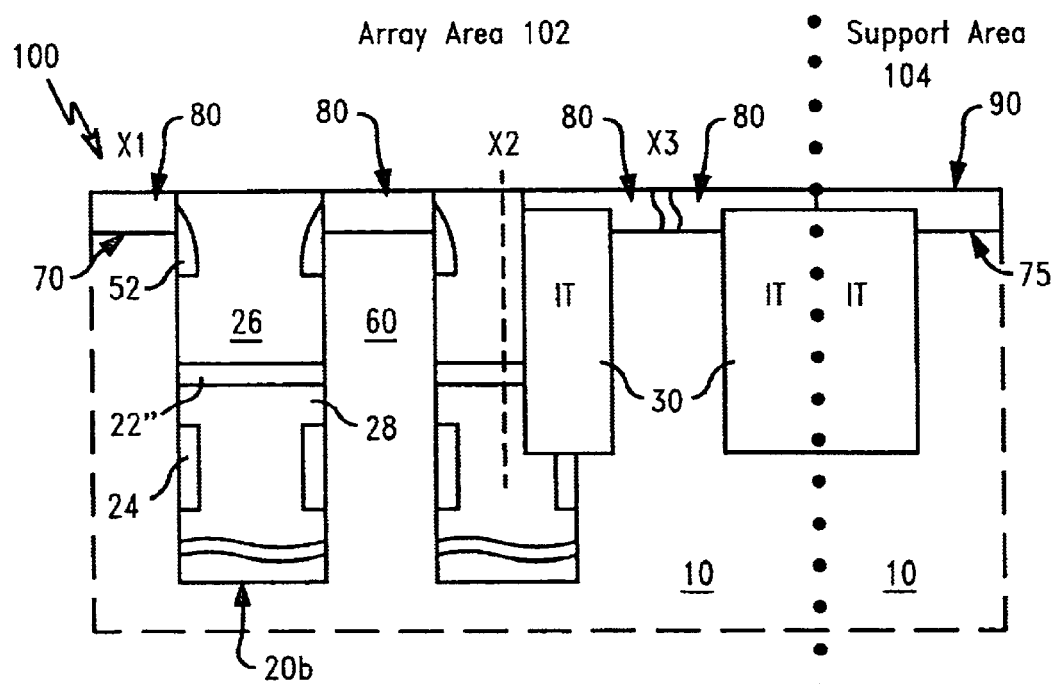
FIG. 8 is a cross sectional view of the resultant DRAM after further processing of the pre-finished DRAM of FIG. 7 including the steps of depositing a gate conductor material over the surface of the substrate, removing the gate conductor material from the array area only using a second mask, removing the second mask, depositing an array top oxide layer over the substrate surface, and then planarizing the substrate surface to leave the array top oxide only in the array area and expose conductive poly of vertical transistors within array areas of the resultant DRAM.

Referring to FIG. 8, after the gate oxidation is formed in the support area, a gate conductor material 90 is deposited over the entire substrate surface, directly over gate oxide 75, and then using a second block mask that covers only the support area 104, the gate conductor material is entirely removed from the array area only. In so doing, the second block mask protects the support area during the process of removal of the gate conductor from the array area. This second block mask is then removed from the substrate surface.

Subsequently, an array top oxide layer 80 is deposited over both array 102 and support 104 areas, preferably via high-density plasma deposition. Once the array top oxide is deposited, the substrate is planarized, preferably by chemical mechanical polishing, so as to leave the array top oxide layer 80 only in the array area 102, therein resulting in the structure as depicted in FIG. 8. In planarizing the substrate surface, planarization preferably stops once the top surface of trenches 20 are reached, therein removing the oxide layer 70 from the trenches 20, exposing a surface of the trenches 20 and leaving remaining portions of gate conductor material 90 only in the support regions of the substrate.

The DRAM may be further processed to form gate conductors (wordlines), bitlines, and back end interconnects by conventional techniques. In so doing, the exposed poly 26 is used as the base of a gate/wordline structure for forming the gate contact to the vertical transistors 60, which extends perpendicular to the plane of the substrate to form at least one of the wordlines of the array. A second wordline, referred to as the "passing wordline," is formed between the two adjacent poly structures 26. This passing wordline makes contact to DRAM cells behind and in front of the trenches 20.

Thus, in accordance with the invention, a simplified process flow, preferably a simplified TOL process, is provided for providing an array top oxide over an array of trenches containing trench capacitors and overlying vertical transistors. As demonstrated in the below comparative table, conventional processes for providing array top oxides require numerous processing steps, such as, depositing additional liner layers over the sacrificial oxidation layer for the purpose of preventing out-diffusion from the array area, whereas the present invention eliminates the need for any additional processing layers by directly forming a blocking mask over the sacrificial oxidation layer and using such mask to remove the sacrificial oxidation layer from the support region only.

TABLE I

| Prior Art Process Flow | Process Flow of the Invention |
| --- | --- |
| Pad SiN strip | Pad SiN strip |
| Pad Oxide strip (pullback) | Pad Oxide strip (pullback) |
| Sacrificial oxidation | Sacrificial oxidation |
| Nitride Liner | Implants |
| ES Mask/Nitride RIE/Resist strip | (Optical Nitride spacer) |
| Support Implants | ES Mask/Sac Ox wet strip/ Resist strip |
| Sacrificial Oxide strip | Gate oxidation |
| Gate oxidation | |

Advantageously, the present invention provides an improved TOL process with a partial lithography-assisted sacrificial oxide strip to prevent arsenic out-diffusion from polysilicon studs during gate oxidation. In particular, it prevents arsenic out-diffusion during gate oxidation from polysilicon studs by completely covering such studs with an oxide layer, thereby maintaining nitrogen amounts in the thin gate oxides region, and hence, maintaining gate oxide thickness and avoiding any increase in Vt's for thin gate devices. The invention eliminates the need for additional liner layers over the sacrificial oxidation layer for the purpose of preventing out-diffusion from the array area by directly forming a blocking mask over the sacrificial oxidation layer and using such mask to remove the sacrificial oxidation layer from the support region only.

While the present invention has been particulary described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of providing an array top oxide over an array of trenches containing trench capacitors and overlying vertical transistors comprising:
   providing a substrate having a first area comprising an array area and a second area;
   providing a sacrificial oxide layer over said first and second areas;
   removing said sacrificial oxide layer only from said second area;
   providing a gate oxide layer over said second area;
   depositing a gate conductor layer over said first and second areas;
   removing said gate conductor layer only from said first area;
   depositing an array top oxide layer over said first and second areas; and
   removing said array top oxide layer from said second area so as to leave remaining portions of said array top oxide layer only in said first area.

2. The method of claim 1 wherein said second area comprises a support area.

3. The method of claim 1 further including, prior to said step of providing said sacrificial oxide layer, the steps of:

removing a pad nitride layer in both said first and second areas to expose a pad oxide layer in both said first and second areas;
   removing at least a portion of said pad oxide layer from both said first and second areas; and
   growing said sacrificial oxide layer over exposed surface areas of said substrate.

4. The method of claim 3 further including, after said step of growing said sacrificial oxide layer, implanting said first and second areas.

5. The method of claim 1 wherein said step of removing said sacrificial oxide layer only from said second area comprises:
   removing said sacrificial oxide layer only from said second area wherein a mask is provided over said first area to protect said first area during said sacrificial oxide layer removal processing; and
   removing said mask from said first area prior to providing said gate oxide layer over said second area.

6. The method of claim 1 wherein said step of removing said gate conductor layer only from said first area comprises:
   removing said gate conductor layer only from said first area wherein a mask is provided over said second area to protect said second area during said gate conductor layer removal processing; and
   removing said mask from said second area prior to depositing said array top oxide layer.

7. The method of claim 1 further including, after processing said substrate, fabricating a final substrate surface using CMOS fabrication technique.

8. A method of providing an array top oxide over an array of trenches containing trench capacitors and overlying vertical transistors comprising:
   providing a substrate having an array area and a support area;
   providing a sacrificial oxide layer over said array and support areas;
   removing said sacrificial oxide layer only from said support area;
   providing a gate oxide layer over said support area;
   depositing a gate conductor layer over said array and support areas;
   removing said gate conductor layer only from said array area;
   depositing an array top oxide layer over said array and support areas; and
   removing said array top oxide layer from said support area so as to leave remaining portions of said array top oxide layer only in said array area.

9. The method of claim 8 wherein said step of removing said sacrificial oxide layer only from said support area comprises:
   removing said sacrificial oxide layer only from said support area wherein a first mask is provided over said array area to protect said array area during said sacrificial oxide layer removal processing; and
   removing said first mask from said array area prior to providing said gate oxide layer over said support area.

10. The method of claim 9 wherein said step of removing said gate conductor layer only from said array area comprises:
   removing said gate conductor layer only from said array area wherein a second mask is provided over said support area to protect said support area during said gate conductor layer removal processing; and removing said second mask from said support area prior to depositing said array top oxide layer.

11. The method of claim 10 wherein said first mask comprises a first etch support lithography mask and said second mask comprises a second etch support lithography mask.

12. The method of claim 8 further including, prior to the step of removing sacrificial oxide layer, the steps of:
   removing a pad nitride layer in both said array and support areas to expose a pad oxide layer in both said array and support areas;
   removing at least a portion of said pad oxide layer from both said array and support areas; and
   growing said sacrificial oxide layer over all exposed surface areas in both said array and support areas.

13. The method of claim 8 wherein said step of removing said sacrificial oxide layer only from said support area prevents any out-diffusion from said array area.

14. The method of claim 8 wherein said gate oxide layer is thermally grown over said support area, said array area being protected by said sacrificial oxide layer to prevent any out-diffusion from said array area.

15. The method of claim 8 wherein said array top oxide layer is deposited by high-density plasma deposition.

16. The method of claim 8 further including, removing said array top oxide layer from said support area by planarizing a surface of said substrate.

17. A method of providing an array top oxide over an array of trenches containing trench capacitors and overlying vertical transistors comprising:
   providing a substrate including an array area and a support area,
   said array area having an array of trenches containing trench capacitors overlying vertical transistors and having a surface over each of said trenches comprising a gate oxide of an adjacent isolation trench, electrically conductive contact, and nitride adjacent to said contact,
   said support area having a plurality of regions of oxide isolation and a plurality of adjacent regions of nitride;
   providing a sacrificial oxide layer over said array and support areas;
   removing said nitride and a portion of said oxide from said array and support areas;
   providing a first mask only over said array area;
   removing said sacrificial oxide layer only from said support area, wherein said first mask protects said array area to protect said trenches comprising said gate oxide, said electrically conductive contact, and said nitride adjacent to the contact in said array areas;
   removing said first mask therein leaving remaining portions of said sacrificial oxide layer only over said array area;
   providing a gate oxide layer only over said support area wherein said sacrificial oxide layer protects said array area so as to prevent alteration to said gate oxide in said array area;
   depositing a gate conductor layer over said array and support areas;
   providing a second mask only over said support area;
   removing said gate conductor layer only from said array area, said second mask protecting said support area during said gate conductor layer removal processing;
   removing said second mask from said support area;
   depositing an array top oxide layer over said array and support areas; and
   removing said array top oxide layer from said support area to leave remaining portions of said array top oxide layer only in said array area.

18. The method of claim 17 wherein said step of removing said sacrificial oxide layer only from said support area prevents arsenic out-diffusion from said array area.

19. The method of claim 18 wherein said gate oxide layer is thermally grown over said support area, said array area being protected by said sacrificial oxide layer to further prevent any arsenic out-diffusion from said array area.

* * * * *